(12) United States Patent
Takei et al.

(10) Patent No.: US 7,432,632 B2
(45) Date of Patent: Oct. 7, 2008

(54) COMPOSITE ELECTRONIC COMPONENT

(75) Inventors: Katsuyuki Takei, Tokyo (JP); Tohru Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/704,275

(22) Filed: Feb. 9, 2007

(65) Prior Publication Data
US 2007/0194665 A1 Aug. 23, 2007

(30) Foreign Application Priority Data
Feb. 23, 2006 (JP) ............................ P2006-047273

(51) Int. Cl.
*H01L 41/08* (2006.01)
*H03H 9/02* (2006.01)

(52) U.S. Cl. ................ 310/320; 310/340; 310/348

(58) Field of Classification Search ................ 310/320, 310/340, 348, 363–365
See application file for complete search history.

(56) References Cited

U.S. PATENT DOCUMENTS

| | | |
|---|---|---|
| 5,091,671 A | 2/1992 | Yoshida |
| 6,087,763 A | 7/2000 | Kim et al. |
| 6,204,593 B1 | 3/2001 | Takahashi et al. |
| 6,568,053 B1 | 5/2003 | Sung et al. |

FOREIGN PATENT DOCUMENTS

| | | | |
|---|---|---|---|
| JP | 62242405 A | * | 10/1987 |
| JP | 06013834 A | * | 1/1994 |
| JP | A Y2 6-33704 | | 8/1994 |
| JP | 06283952 A | * | 10/1994 |
| JP | 06310974 A | * | 11/1994 |
| JP | A 8-84043 | | 3/1996 |
| JP | A 8-316776 | | 11/1996 |
| JP | 09148799 A | * | 6/1997 |
| JP | 2000059172 A | * | 2/2000 |
| JP | 2000196402 A | * | 7/2000 |

* cited by examiner

*Primary Examiner*—Jaydi A San Martin
(74) *Attorney, Agent, or Firm*—Oliff & Berridge, PLC

(57) ABSTRACT

A composite electronic component provided is one with sufficient impact resistance. In this resonator 1, a capacitive element 3 has a projection 37 projecting outside a piezoelectric element 2, from a portion of the capacitive element 3 coinciding with a vibration region 2a. The projection 37 is provided on each of two sides of the capacitive element 3 in a direction substantially perpendicular to a longitudinal direction of the capacitive element 3. This causes the projections 37 of the capacitive element 3 to be buried in a mold resin 5, whereby the capacitive element 3 is sufficiently fixed to the mold resin 5 even if the mold resin 5 is provided with a vibration space 5a containing the vibration region 2a of the piezoelectric element 2. Therefore, an improvement is made in impact resistance of the resonator 1.

3 Claims, 9 Drawing Sheets

COMPOSITE ELECTRONIC COMPONENT

BACKGROUND OF THE INVENTION

1. Field of the Invention

The present invention relates to a composite electronic component involving a piezoelectric element and a capacitive element, for example, such as a resonator.

2. Related Background Art

A conventionally known composite electronic component in the foregoing technical field is one having a piezoelectric element, a capacitive element, a lead terminal group electrically connected through a connection part thereto, and a coating member for coating the piezoelectric element, the capacitive element, and the connection part of the lead terminal group (e.g., reference is made to Japanese Utility Model Publication No. 6-33704).

SUMMARY OF THE INVENTION

However, the composite electronic component as described above had the problem that fixation of the capacitive element was insufficient to the coating member because the coating member was provided with a vibration space containing a vibration region of the piezoelectric element, and that the component had low impact resistance.

An object of the present invention is therefore to provide a composite electronic component with high impact resistance.

In order to achieve the above object, a composite electronic component according to the present invention is a composite electronic component comprising: a piezoelectric element having a vibration region; a capacitive element juxtaposed to one side of the piezoelectric element in a predetermined direction; a lead terminal group electrically connected through a connection part to the piezoelectric element and to the capacitive element; and a coating member having a vibration space containing the vibration region, and arranged to coat the piezoelectric element, the capacitive element, and the connection part of the lead terminal group; wherein, when viewed from the predetermined direction, the capacitive element has a projection projecting outside the piezoelectric element, from a portion of the capacitive element coinciding with the vibration region.

In this composite electronic component, the capacitive element has the projection projecting outside the piezoelectric element, from the portion of the capacitive element coinciding with the vibration region. This causes the projection of the capacitive element to be buried in the coating member, whereby the capacitive element is sufficiently fixed to the coating member even if the coating member is provided with the vibration space containing the vibration region of the piezoelectric element. Therefore, an improvement is made in the impact resistance of the composite electronic component.

In the composite electronic component of the present invention, preferably, the piezoelectric element has a piezoelectric portion including the vibration region, a first piezoelectric element electrode formed on one surface of the piezoelectric portion and facing the vibration region along the predetermined direction, and a second piezoelectric element electrode formed on another surface of the piezoelectric portion and facing the vibration region along the predetermined direction; the capacitive element has a dielectric portion, a first capacitive element electrode formed on one surface of the dielectric portion, a second capacitive element electrode formed on an other surface of the dielectric portion, and a third capacitive element electrode formed on the other surface of the dielectric portion; and the lead terminal group has a first lead terminal electrically connected to the first piezoelectric element electrode and to the second capacitive element electrode, a second lead terminal electrically connected to the second piezoelectric element electrode and to the third capacitive element electrode, and a third lead terminal electrically connected to the first capacitive element electrode.

This configuration makes it feasible to provide a resonator with sufficient impact resistance.

In the composite electronic component of the present invention, preferably, the projection is provided on each of two sides of the capacitive element in a direction substantially perpendicular to the predetermined direction.

In this configuration, the projections on the both sides of the capacitive element are buried in the coating member, whereby the capacitive element is more firmly fixed to the coating member, so as to further improve the impact resistance of the composite electronic component.

In the composite electronic component of the present invention, preferably, the projection is provided so that the capacitive element is arranged as shifted from the piezoelectric element in a direction substantially perpendicular to the predetermined direction.

This configuration permits the projection of the capacitive element to be provided in a wide area and without difficulty. In addition, when the capacitive element is arranged as shifted from the piezoelectric element, the piezoelectric element can have a projection projecting outside the capacitive element. In this case, the projection of the capacitive element is buried in the coating member while the projection of the piezoelectric element is also buried in the coating member. This results in sufficiently fixing the capacitive element and the piezoelectric element both to the coating member and thus achieves a farther improvement in the impact resistance of the composite electronic component.

DESCRIPTION OF THE PREFERRED EMBODIMENTS

The preferred embodiments of the composite electronic component according to the present invention will be described below in detail with reference to the drawings. In the drawings identical or equivalent portions will be denoted by the same reference symbols, without redundant description.

Figure 1:
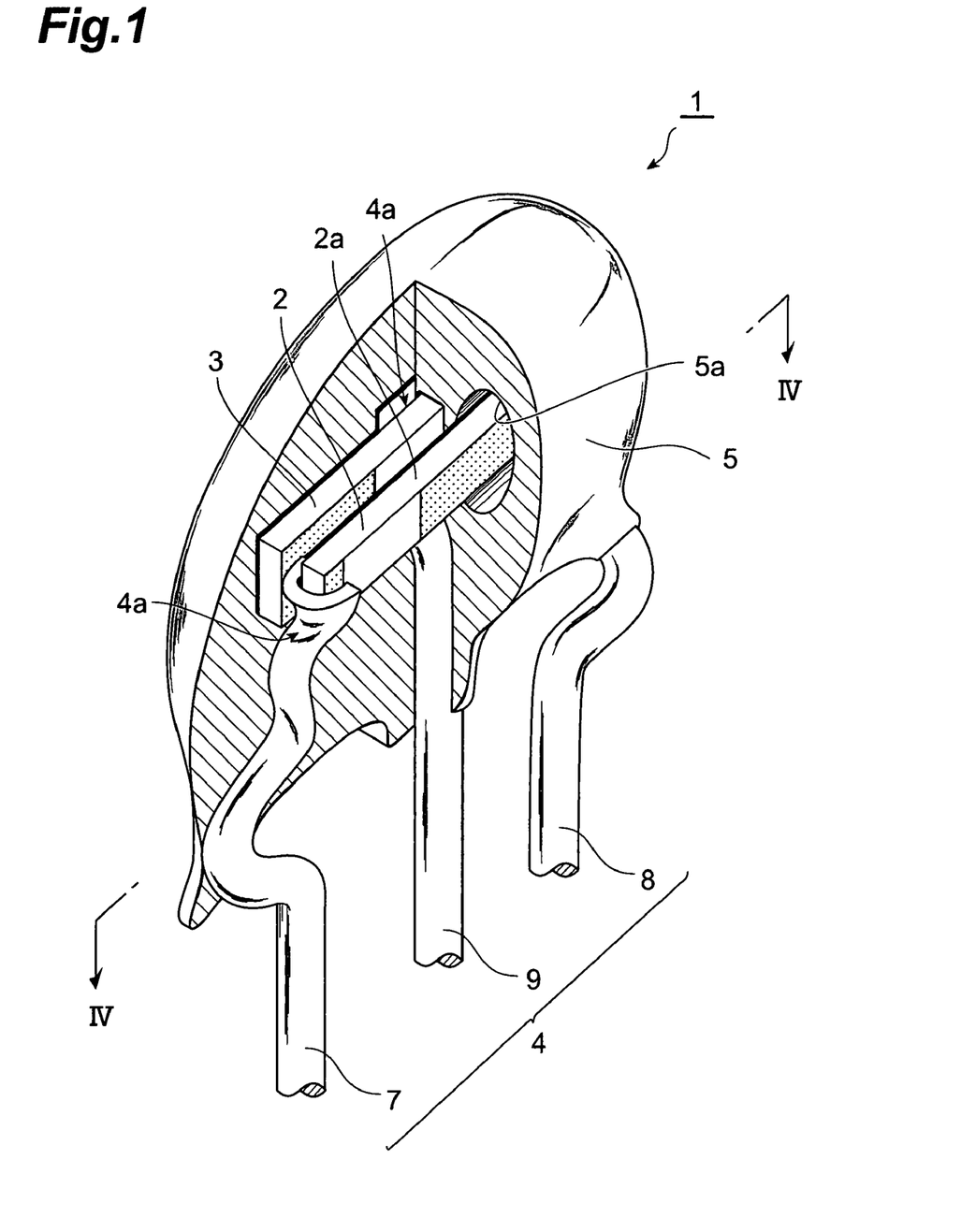
FIG. 1 is a perspective view of a resonator which is an embodiment of the composite electronic component according to the present invention.

As shown in FIG. 1, a resonator (composite electronic component) 1 comprises a piezoelectric element 2 of a rectangular plate shape having a vibration region 2a whose vibration mode is thickness-shear vibration, a capacitive element 3 of a rectangular plate shape juxtaposed to one side of the piezoelectric element 2 in a thickness direction of the piezoelectric element 2 (predetermined direction) (which will be referred to hereinafter simply as "thickness direction"), and a lead terminal group 4 electrically connected through connection portions 4a to the piezoelectric element 2 and to the capacitive element 3.

Furthermore, the resonator 1 comprises a mold resin (coating member) 5 for coating the piezoelectric element 2, the capacitive element 3, and the connection portions 4a of the lead terminal group 4. The mold resin 5 is provided with a vibration space 5a containing the vibration region 2a.

Figure 2:
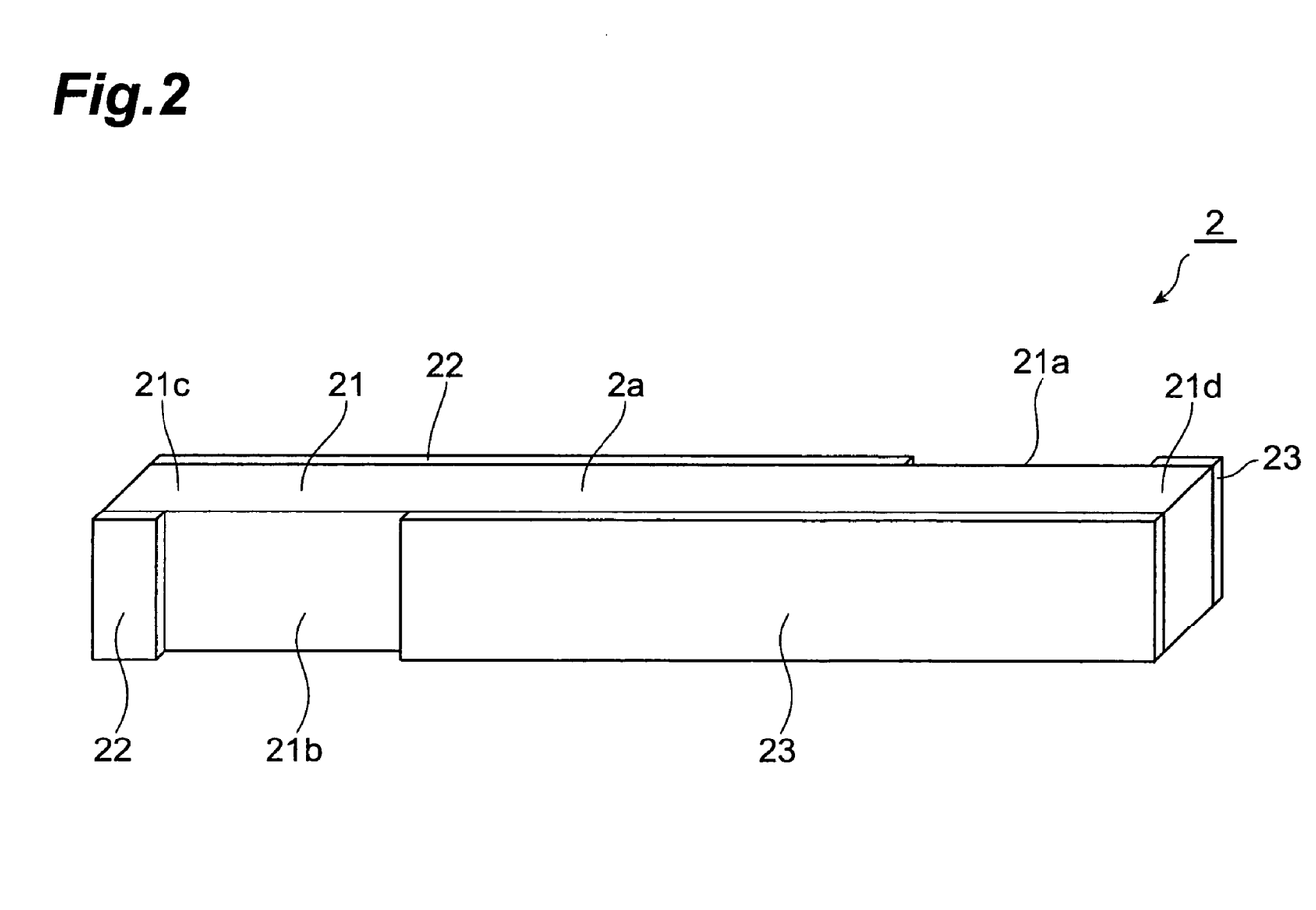
FIG. 2 is a perspective view of a piezoelectric element in the resonator shown in FIG. 1.

As shown in FIG. 2, the piezoelectric element 2 has a piezoelectric portion 21 of a rectangular plate shape including the vibration region 2a, an electrode (first piezoelectric element electrode) 22 formed on one surface 21a of the piezoelectric portion 21 and facing the vibration region 2a along the thickness direction, and an electrode (second piezoelectric element electrode) 23 formed on another surface 21b of the piezoelectric portion 21 and facing the vibration region 2a along the thickness direction. Namely, the vibration region 2a is defined as a region between the electrode 22 and the electrode 23 along the thickness direction in the piezoelectric portion 21.

Figure 3:
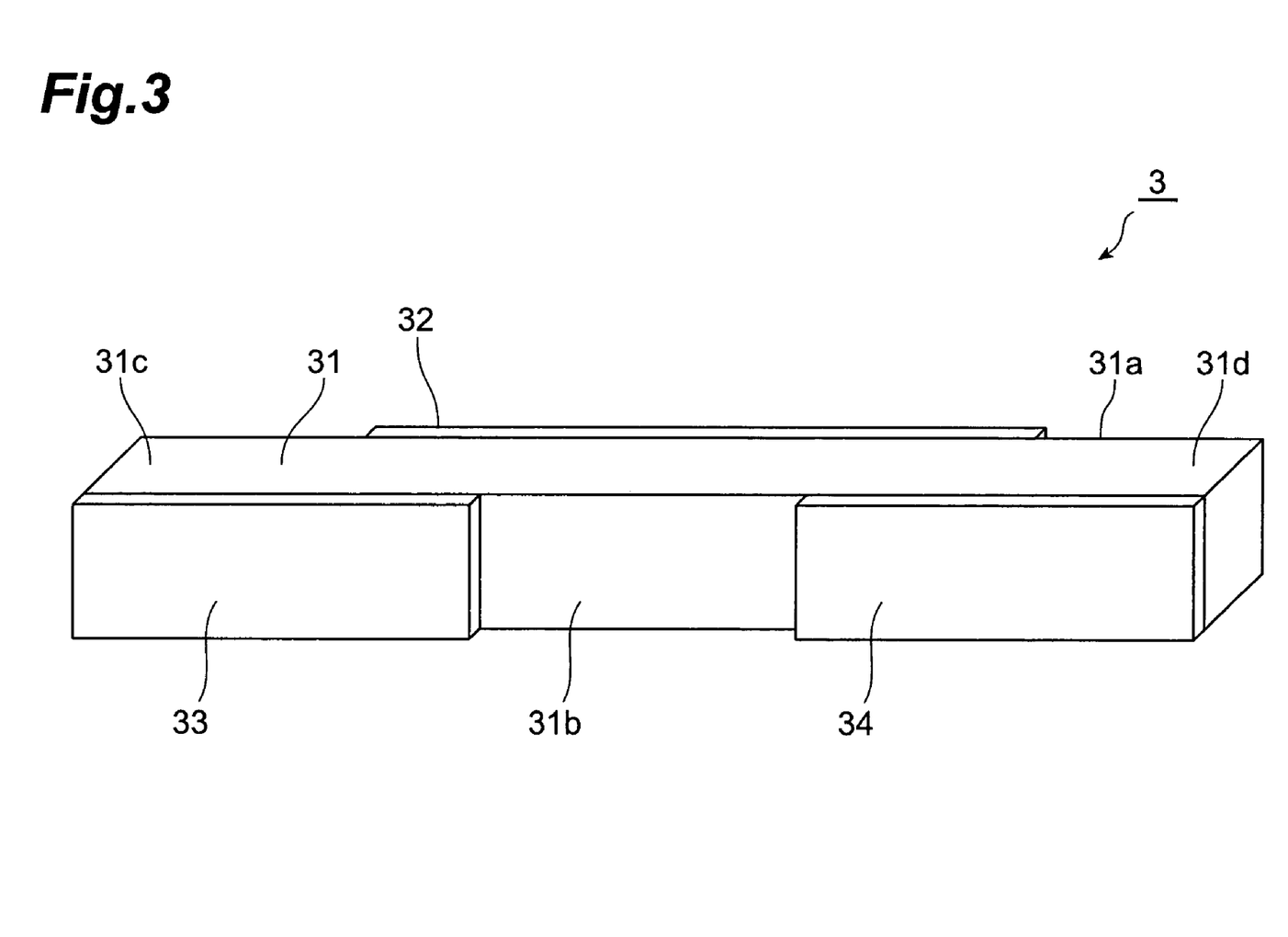
FIG. 3 is a perspective view of a capacitive element in the resonator shown in FIG. 1.

As shown in FIG. 3, the capacitive element 3 has a dielectric portion 31 of a rectangular plate shape, an electrode (first capacitive element electrode) 32 formed on one surface 31b of the dielectric portion 31, an electrode (second capacitive element electrode) 33 formed on the end 31c side in the longitudinal direction on another surface 31b of the dielectric portion 31, and an electrode (third capacitive element electrode) 34 formed on the end 31d side in the longitudinal direction on the other surface 31b of the dielectric portion 31.

Figure 4:
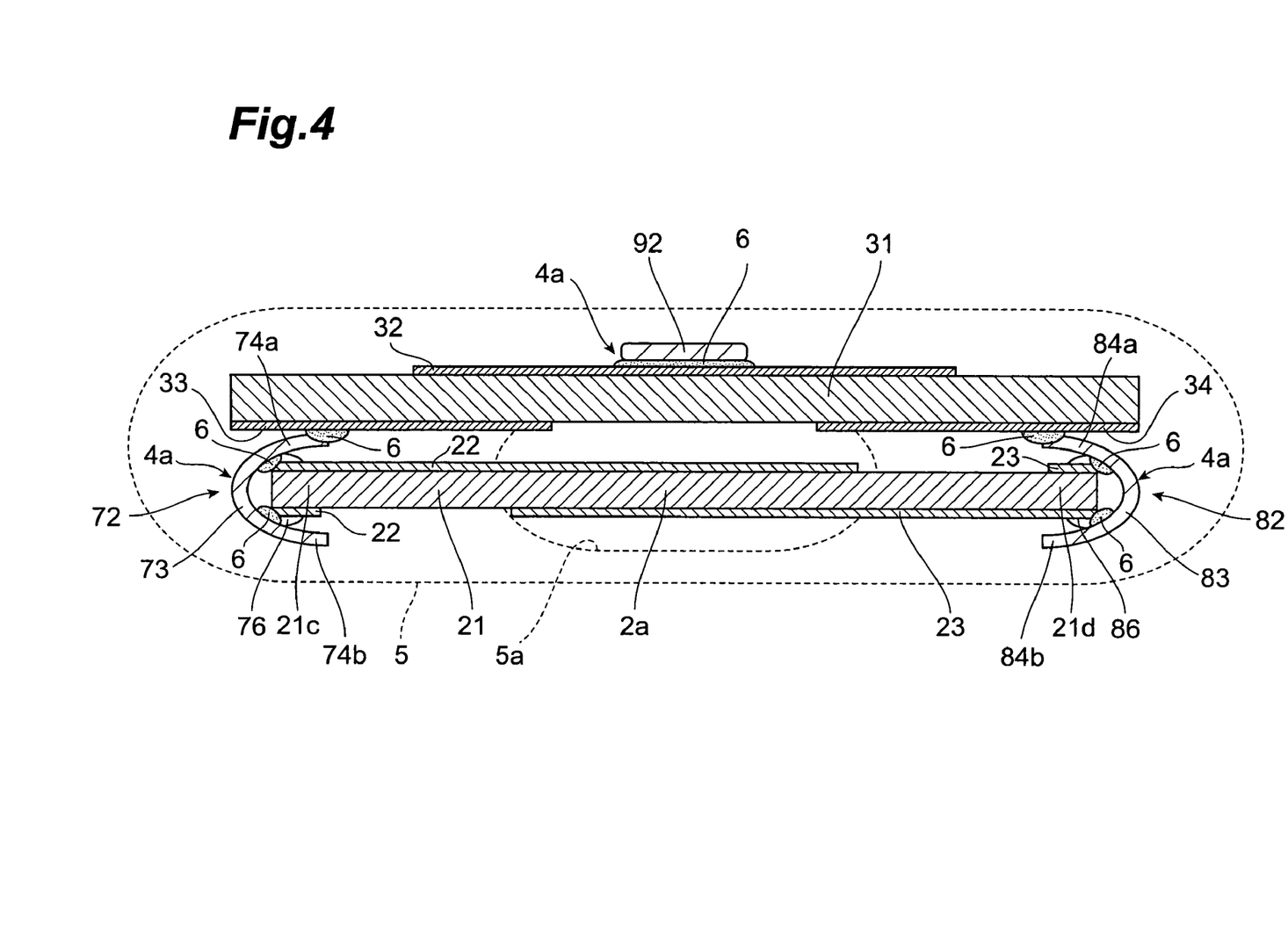
FIG. 4 is a sectional view along line IV-IV shown in FIG. 1.

As shown in FIGS. 1 and 4, the lead terminal group 4 has a lead terminal (first lead terminal) 7 electrically and physically connected to the electrode 22 of the piezoelectric element 2 and to the electrode 33 of the capacitive element 3 by solder 6, a lead terminal (second lead terminal) 8 electrically and physically connected to the electrode 23 of the piezoelectric element 2 and to the electrode 34 of the capacitive element 3 by solder 6, and a lead terminal (third lead terminal) 9 electrically and physically connected to the electrode 32 of the capacitive element 3 by solder 6.

Figure 5:
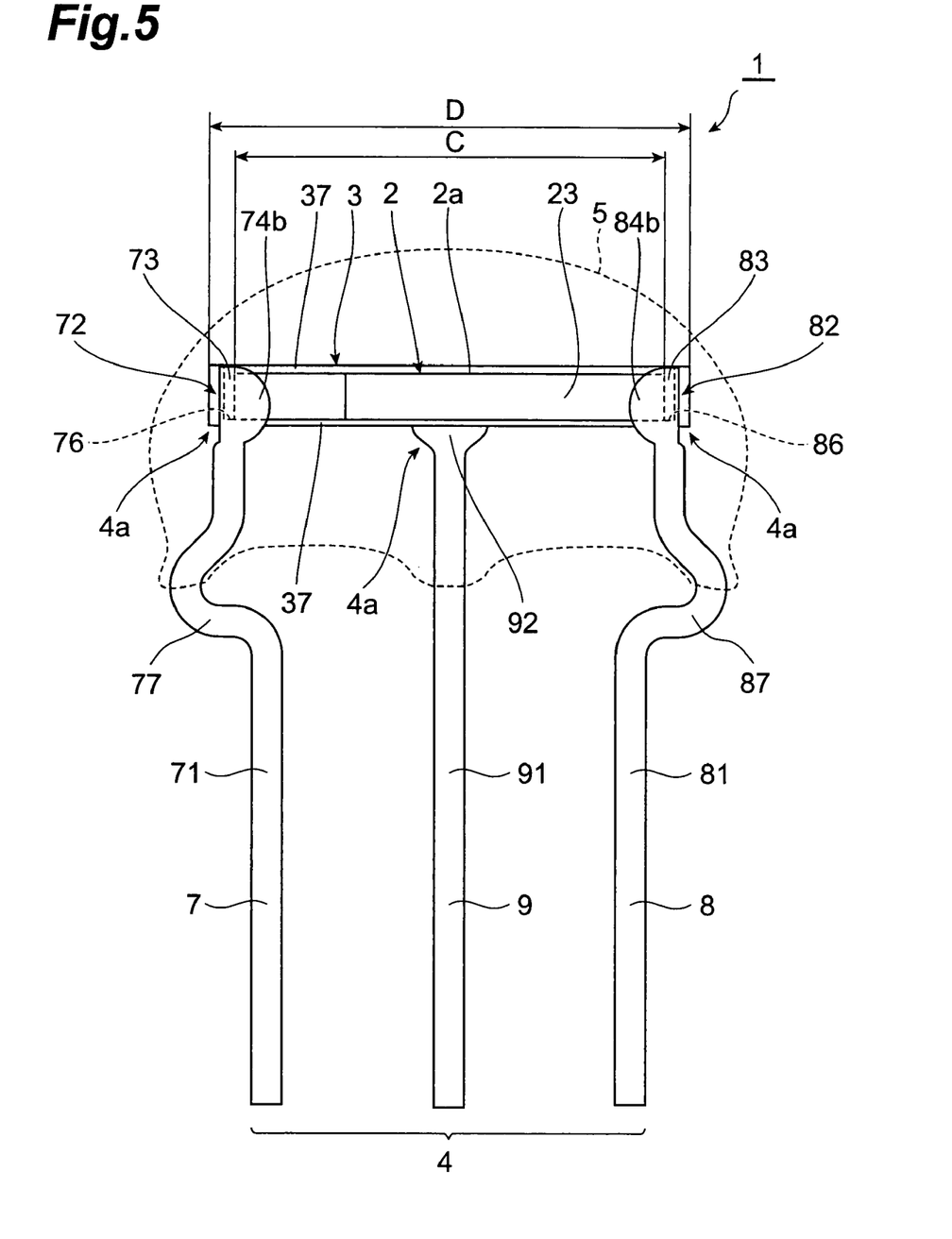
FIG. 5 is a front view of the resonator shown in FIG. 1.
Figure 6:
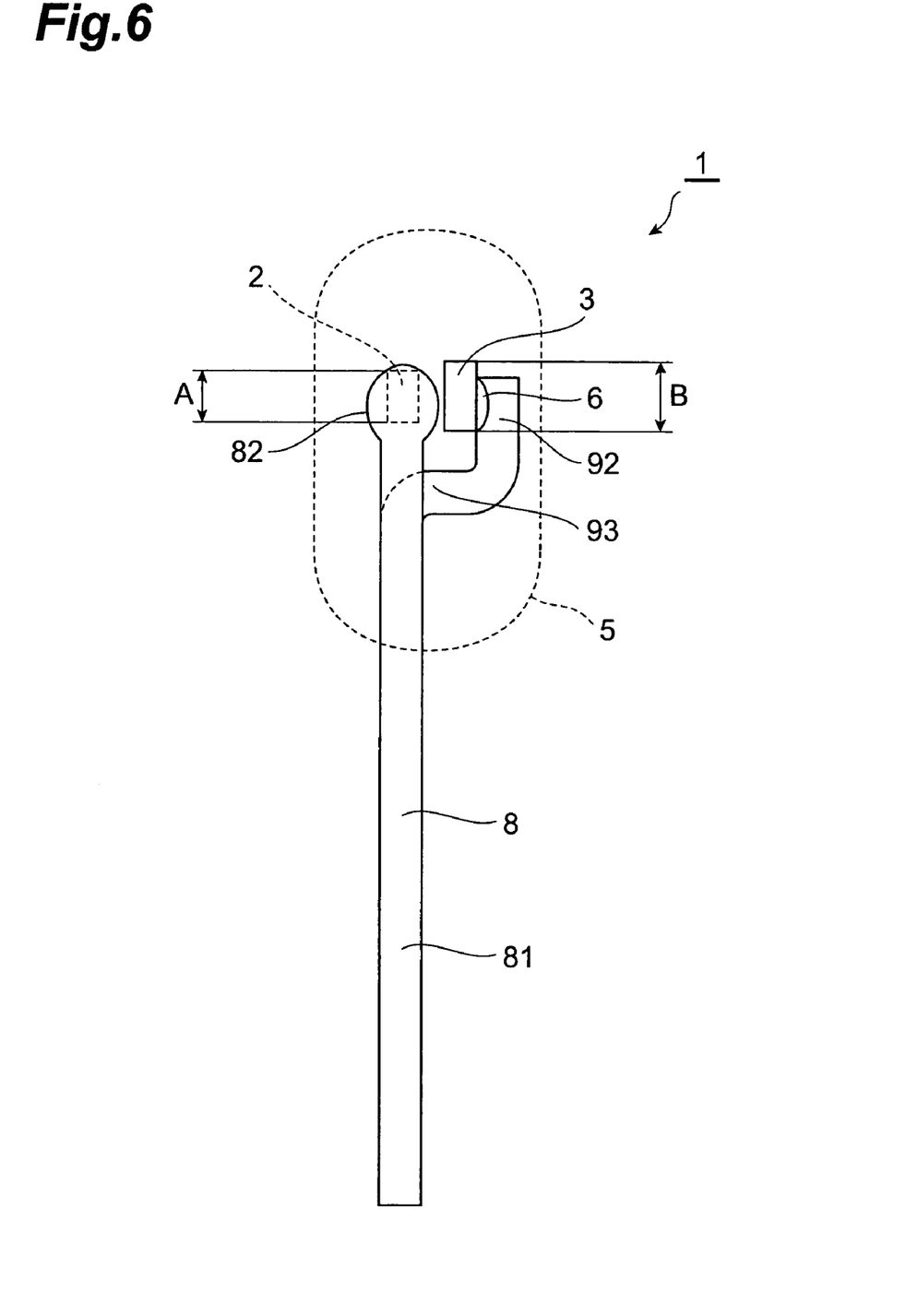
FIG. 6 is a side view of the resonator shown in FIG. 1.

As shown in FIGS. 4 to 6, the lead terminal 7 has a lead portion 71 extending in a direction substantially perpendicular to the longitudinal direction of the piezoelectric element 2, a platelike holding portion (first holding portion) 72 formed at one end on the connection portion 4a side of the lead portion 71 and holding one end 2c in the longitudinal direction of the piezoelectric element 2, a mount portion 76 which is formed between the lead portion 71 and the holding portion 72, and on which the one end 2c of the piezoelectric element 2 is mounted, and a curve portion 77 formed in the lead portion 71.

The holding portion 72 has a receiver (first receiver) 73 curved so as to pinch the one end 2c of the piezoelectric element 2, and the receiver 73 is in contact with the electrode 22 at corners of the one end 2c of the piezoelectric element 2. Furthermore, the holding portion 72 has an edge part (first edge part) 74a and an edge part 74b becoming more distant from the piezoelectric element 2 with distance from the receiver 73 toward the other end 2d in the longitudinal direction of the piezoelectric element 2, and the edge part 74a is in contact with the electrode 33 of the capacitive element 3. The contact portions between the receiver 73 and the electrode 22, and the contact portion between the edge part 74a and the electrode 33 are fixed by solder 6. In this manner, the lead terminal 7 and the electrodes 22 and 33 are electrically and physically connected.

The mount portion 76 positions the piezoelectric element 2 in the direction substantially perpendicular to the longitudinal direction of the piezoelectric element 2. The curve portion 77 is formed by bending the lead portion 71 outward into an approximate U-shape. The curve portion 77 serves as a stopper during insertion of the lead portion 71 into a mounting hole of a circuit board, and keeps the piezoelectric element 2 and the capacitive element 3 horizontal.

The lead terminal 8 has a lead portion 81 extending in the direction substantially perpendicular to the longitudinal direction of the piezoelectric element 2, a platelike holding portion (second holding portion) 82 formed at an end on the connection portion 4a side of the lead portion 81 and holding the other end 2d of the piezoelectric element 2, a mount portion 86 which is formed between the lead portion 81 and the holding portion 82 and on which the other end 2d of the piezoelectric element 2 is mounted, and a curve portion 87 formed in the lead portion 81.

The holding portion 82 has a receiver (second receiver) 83 curved so as to pinch the other end 2d of the piezoelectric element 2, and the receiver 83 is in contact with the electrode 23 at corners of the other end 2d of the piezoelectric element 2. Furthermore, the holding portion 82 has an edge part (second edge part) 84a and an edge part 84b becoming more distant from the piezoelectric element 2 with distance from the receiver 83 toward the one end 2c of the piezoelectric element 2, and the edge part 84a is in contact with the electrode 34 of the capacitive element 3. The contact portions between the receiver 83 and the electrode 23, and the contact portion between the edge part 84a and the electrode 34 are fixed by solder 6. In this manner, the lead terminal 8 and the electrodes 23 and 34 are electrically and physically connected.

The mount portion 86 positions the piezoelectric element 2 in the direction substantially perpendicular to the longitudinal direction of the piezoelectric element 2. The curve portion 87 is formed by bending the lead portion 81 outward into an approximate U-shape. The curve portion 87 serves as a stopper during insertion of the lead portion 81 into a mounting hole of a circuit board, and keeps the piezoelectric element 2 and the capacitive element 3 horizontal.

The lead terminal 9 has a lead portion 91 extending in the direction substantially perpendicular to the longitudinal direction of the capacitive element 3, a platelike holding portion 92 formed at an end on the connection portion 4a side of the lead portion 91, and a curve portion 93 formed in the lead portion 91.

The holding portion 92 is in contact with the electrode 32 of the capacitive element 3, and the contact portion between the holding portion 92 and the electrode 32 is fixed by solder 6. In this manner, the lead terminal 9 and the electrode 32 are electrically and physically connected.

The curve portion 93 is formed by bending the lead portion 91 outward into a crank shape.

As shown in FIG. 5, the capacitive element 3, when viewed from the thickness direction, has projections 37 projecting outside the piezoelectric element 2, from a portion of the capacitive element 3 coinciding with the vibration region 2a of the piezoelectric element 2. The projections 37 are provided on both sides of the capacitive element 3 in the direction substantially perpendicular to the longitudinal direction of the capacitive element 3.

A method of producing the above-described resonator 1 will be described below.

The lead portions 71, 81, 91 of the lead terminals 7-9 are fixed at equal intervals by tape. In the fixed state by tape, they are shaped to form the holding portion 72, mount portion 76, and curve portion 77 of the lead terminal 7, the holding portion 82, mount portion 86, and curve portion 87 of the lead terminal 8, and the holding portion 92 and curve portion 93 of the lead terminal 9. Then a solder cream is transferred onto the holding portions 72, 82, 92.

Subsequently, the piezoelectric element 2 is inserted into between the holding portion 72 and the holding portion 82 to be mounted on the mount portions 76, 86. Furthermore, the capacitive element 3 is inserted into between the edge part 74a of the holding portion 72 and the edge part 84a of the holding portion 82, and the holding portion 92. At this time, the capacitive element 3 is located relative to the piezoelectric element 2 so that the projections 37 are provided on both sides of the capacitive element 3 in the direction substantially perpendicular to the longitudinal direction of the capacitive element 3. Then the solder cream transferred onto the holding portions 72, 82, 92 is heated to melt. This results in electrically and physically connecting the piezoelectric element 2 to the lead terminals 7, 8 and electrically and physically connecting the capacitive element 3 to the lead terminals 7-9. The intermediate of the resonator 1 at this point is set with the piezoelectric element 2 on the upper side and with the capacitive element 3 on the lower side.

Figure 7:
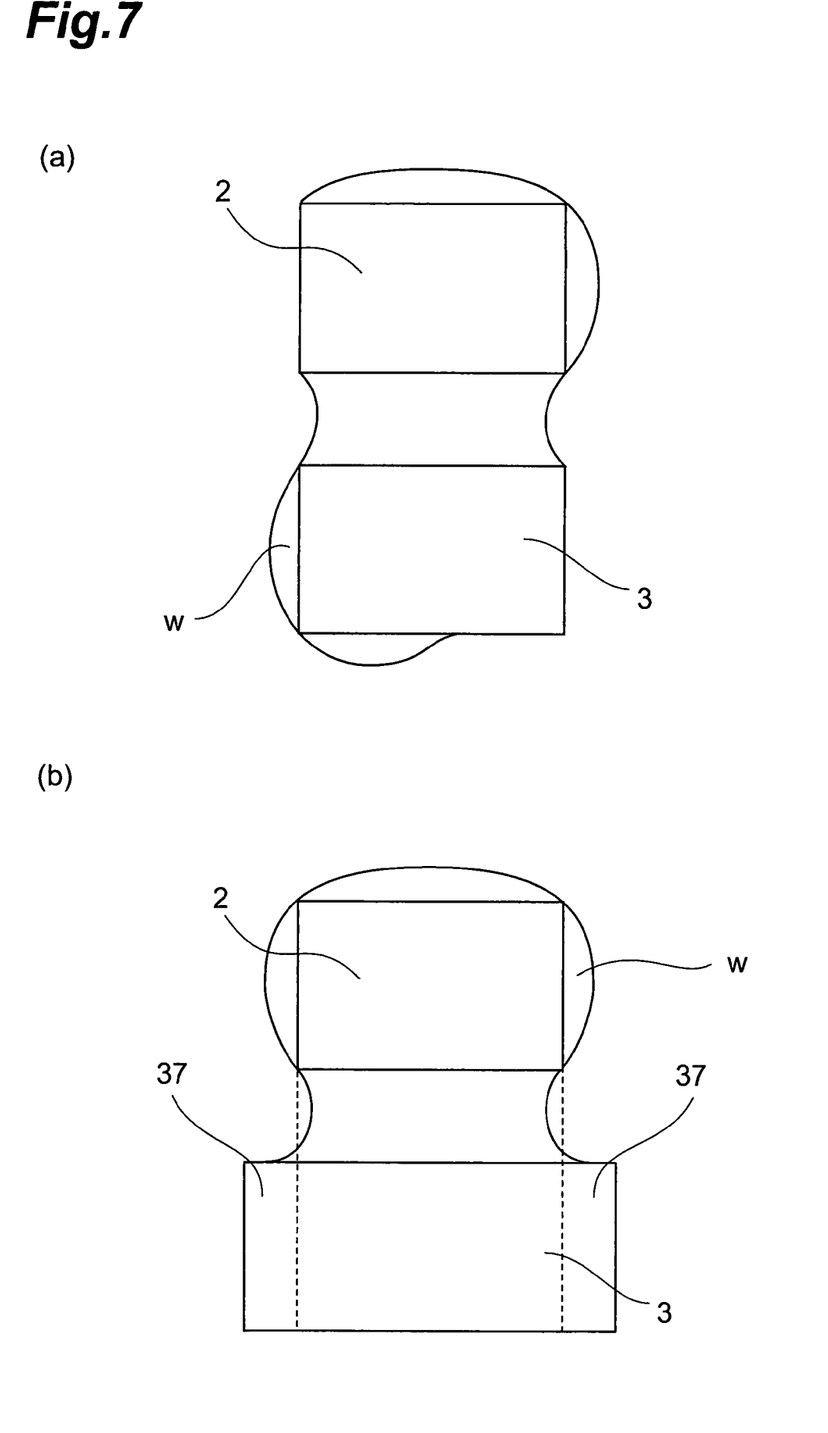
FIG. 7 is a drawing as side views of the piezoelectric element and the capacitive element during application of wax, wherein (a) shows a state during application of wax to a conventional resonator and (b) a state during application of wax to the resonator shown in FIG. 1.

Subsequently, wax W for formation of the vibration space 5a is applied with a trowel from above onto the peripheral part of the vibration region 2a of the piezoelectric element 2. If the piezoelectric element 2 and the capacitive element 3 having approximately equal widths in the direction substantially perpendicular to the longitudinal direction of the piezoelectric element 2 and the capacitive element 3 were vertically juxtaposed, as shown in FIG. 7(a), the wax W could flow around onto the lower surface of the capacitive element 3. Furthermore, if the wax W should flow around onto the lower surface of the capacitive element 3, it could result in an insufficient amount of wax W applied on the peripheral part of the vibration region 2a. However, when the capacitive element 3 is provided with the projections 37, as shown in FIG. 7(b), the projections 37 receive the wax W, prevent the wax W from flowing around onto the lower surface of the capacitive element 3, and facilitate flowing of the wax W into between the piezoelectric element 2 and the capacitive element 3. Since the applied wax W is securely received in this manner, it can also improve the working efficiency of the wax application step. It is also feasible to prevent the wax W from being applied to the edge portions of the projections 37.

Subsequently, the mold resin 5 is applied so as to coat the piezoelectric element 2, the capacitive element 3, and the connection portions 4a of the lead terminal group 4. Then the resonator 1 at this point is heated to evaporate the wax W laid on the peripheral part of the vibration region 2a, thereby forming the vibration space 5a in the mold resin 5. The edge portions of the projections 37 in the capacitive element 3, onto which the wax W was not applied, are buried in the mold resin 5.

Resonators 1 with the resonance frequency of 4 MHz were fabricated with variation in the size difference between the size A of the piezoelectric element 2 and the size B of the capacitive element 3, as shown in FIG. 6, and fluctuations of resonant resistance thereof were measured. Projecting amounts were determined to be equal for the projections 37 provided on both sides of the capacitive element 3 in the direction substantially perpendicular to the longitudinal direction of the capacitive element 3.

Figure 8:
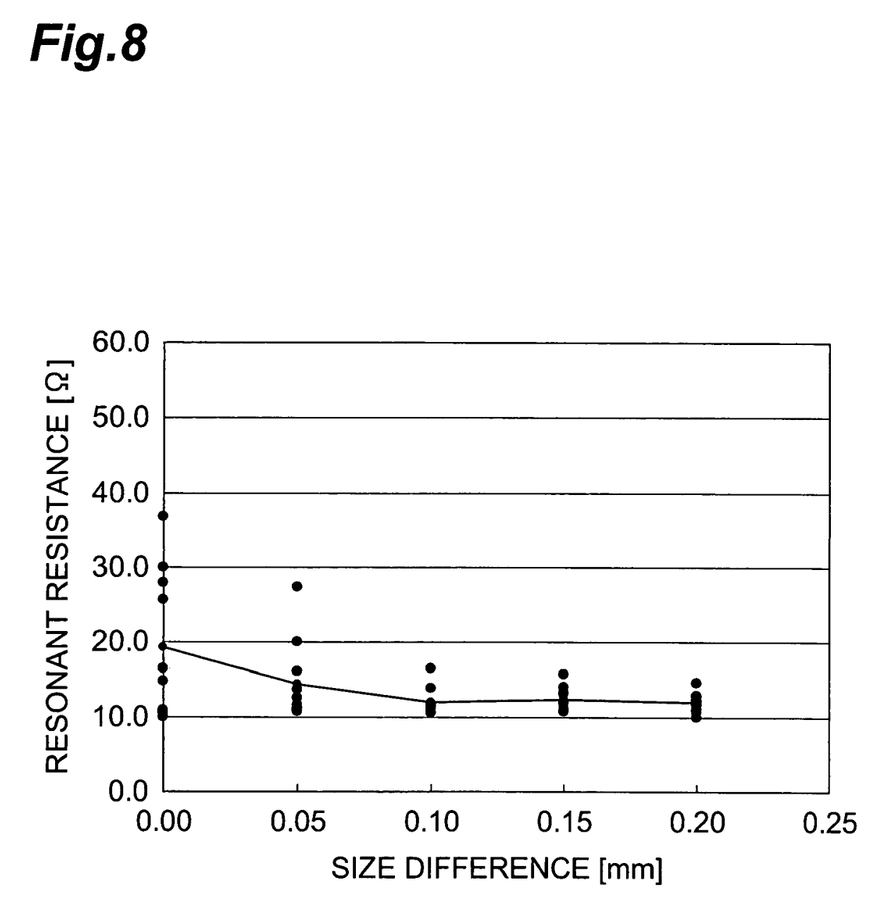
FIG. 8 is a characteristic diagram showing fluctuations of resonant resistance of the resonator shown in FIG. 1.

As shown in FIG. 8, fluctuations of resonant resistance decrease with increase in the size difference (size B−size A). Namely, it was confirmed that as far as sufficient projecting amounts were secured for the projections 37, the wax was applied on a stable basis and the characteristics of the resonator 1 became stable. The size difference (size B−size A) is preferably 0.15 mm or more. The dimensions of the piezoelectric element 2 in this case are 0.65 mm (size A)×6.5 mm (size C)×0.313 mm (thickness), and the dimensions of the capacitive element 3 are 0.8 mm (size B)×7.0 mm (size D)×0.35 mm (thickness).

The operational effect of the resonator 1 described above will be described below.

In this resonator 1, the capacitive element 3 has the projections 37 projecting outside the piezoelectric element 2, from the portion of the capacitive element 3 coinciding with the vibration region 2a. The projections 37 are provided on both sides of the capacitive element 3 in the direction substantially perpendicular to the longitudinal direction of the capacitive element 3. This results in burying the projections 37 of the capacitive element 3 into the mold resin 5, whereby the capacitive element 3 is sufficiently fixed to the mold resin 5 even if the mold resin 5 is provided with the vibration space 5a containing the vibration region 2a of the piezoelectric element 2. Therefore, an improvement is made in the impact resistance of the resonator 1.

Figure 9:
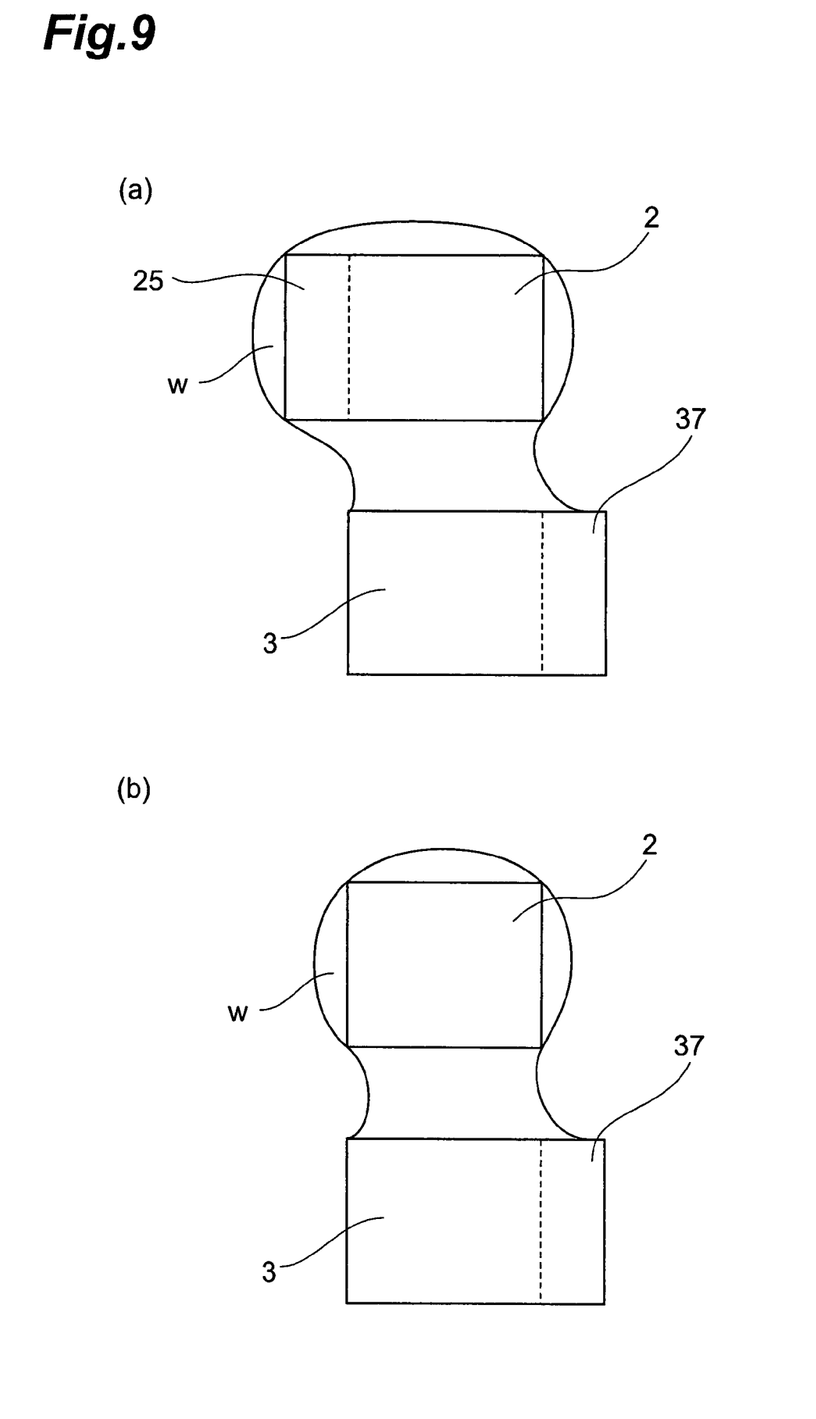
FIG. 9 is a drawing as side views of the piezoelectric element and the capacitive element during application of wax to a resonator according to a modification example, wherein (a) shows a state in which the piezoelectric element and the capacitive element are provided with their respective projections and (b) a state in which the capacitive element is provided with a projection only on one side.

Another potential configuration is, as shown in FIG. 9(a), such that a projection 37 is provided so that the capacitive element 3 is arranged as shifted from the piezoelectric element 2 in a direction substantially perpendicular to the thickness direction. This permits the projection 37 of the capacitive element 3 to be provided in a wide area and without difficulty. In addition, when the capacitive element 3 is arranged as shifted from the piezoelectric element 2, the piezoelectric element 2 can have a projection 25 projecting outside the capacitive element 3, in certain cases. In such cases, the projection 37 of the capacitive element 3 is buried in the mold resin 5 while the projection 25 of the piezoelectric element 2 is also buried in the mold resin 5; therefore, not only the capacitive element 3, but the piezoelectric element 2 is also sufficiently fixed to the mold resin 5, whereby a further improvement is made in the impact resistance of the resonator 1. As shown in FIG. 9(b), a projection 37 may be provided only on one side of the capacitive element 3.

In this resonator 1, the piezoelectric element 2 is supported by the receivers 73, 83 included in the platelike holding portions 72, 82, and the edge parts 74a, 84a in the holding portions 72, 82 are in contact with the capacitive element 3. This results in keeping the distance constant between the piezoelectric element 2 and the capacitive element 3. Furthermore, even if an impact is exerted on the resonator 1, the impact will be absorbed by the platelike holding portions 72, 82. Therefore, an improvement is made in the impact resistance of the resonator 1.

Since the receiver 73 is curved so as to pinch the one end 21c of the piezoelectric element 2 and the receiver 83 is curved so as to pinch the other end 21d of the piezoelectric element 2, they present a further improvement in buffer effect of the holding portions 72, 82. In addition, since the receivers 73, 83 are curved so as to pinch the two ends on the piezoelectric element 2 side, the piezoelectric element 2 can be supported at the predetermined position even with variation in the thickness of the piezoelectric element 2. This effect can also be achieved by approximately V-shaped receivers 73, 83, but it is noted that the same effect can be achieved in a smaller space by the curved receivers 73, 83.

The present invention improves the impact resistance of the composite electronic component.

What is claimed is:

1. A composite electronic component comprising:
    a piezoelectric element having a vibration region;
    a capacitive element juxtaposed to one side of the piezoelectric element in a predetermined direction;
    a lead terminal group electrically connected through a connection part to the piezoelectric element and to the capacitive element, and extended in an extension direction substantially perpendicular to the predetermined direction; and
    a coating member having a vibration space containing the vibration region, and arranged to coat the piezoelectric element, the capacitive element, and the connection part of the lead terminal group;
    wherein, when projected along the predetermined direction, the capacitive element is wider than the piezoelectric element on both sides of the piezoelectric element in the extension direction, at least at a portion of the capacitive element coinciding with the vibration region.

2. The composite electronic component according to claim 1,
    wherein the piezoelectric element has a piezoelectric portion including the vibration region, a first piezoelectric element electrode formed on one surface of the piezoelectric portion and facing the vibration region along the predetermined direction, and a second piezoelectric element electrode formed on another surface of the piezoelectric portion and facing the vibration region along the predetermined direction,
    wherein the capacitive element has a dielectric portion, a first capacitive element electrode formed on one surface of the dielectric portion, a second capacitive element electrode formed on an other surface of the dielectric portion, and a third capacitive element electrode formed on the other surface of the dielectric portion, and
    wherein the lead terminal group has a first lead terminal electrically connected to the first piezoelectric element electrode and to the second capacitive element electrode, a second lead terminal electrically connected to the second piezoelectric element electrode and to the third capacitive element electrode, and a third lead terminal electrically connected to the first capacitive element electrode.

3. A composite electronic component comprising:
    a piezoelectric element having a vibration region;
    a capacitive element disposed on one side of the piezoelectric element in a predetermined direction;
    a lead terminal group electrically connected through a connection part to the piezoelectric element and to the capacitive element, and extended in an extension direction substantially perpendicular to the predetermined direction;
    a coating member having a vibration space containing the vibration region, and arranged to coat the piezoelectric element, the capacitive element, and the connection part of the lead terminal group, wherein when viewed from the predetermined direction, the capacitive element has two projections, one of which extends beyond the piezoelectric element on one side in the extension direction and the other of which extends beyond the piezoelectric element on another side in the extension direction, from a portion of the capacitive element coinciding with the vibration region; and
    a portion of the coating member is formed between at least a portion of the piezoelectric element and at least a portion of the capacitive element, such that the capacitive element is sufficiently fixed to the coating member.

* * * * *